United States Patent [19]

Dorsman

[11] 3,918,050

[45] Nov. 4, 1975

[54] ANALOG-TO-DIGITAL CONVERSION APPARATUS

[75] Inventor: Adrian K. Dorsman, Bellflower, Calif.

[73] Assignee: Rockwell International Corporation, El Segundo, Calif.

[22] Filed: Nov. 18, 1974

[21] Appl. No.: 524,841

[52] U.S. Cl.... 340/347 AD; 340/347 NT; 324/99 D

[51] Int. Cl.[2] .......... H03K 13/20

[58] Field of Search.......... 340/347 AD, 347 NT; 324/99 D; 235/183

*Primary Examiner*—Malcolm A. Morrison

*Assistant Examiner*—Vincent J. Sunderdick

*Attorney, Agent, or Firm*—H. Frederick Hamann; Rolf M. Pitts; George Jameson

[57] ABSTRACT

An analog-to-digital conversion apparatus wherein, in one embodiment, an input analog current is applied to an input of an integrating circuit, while a switching circuit allows a precision reference current to be summed with the input analog current at the input of the integrating circuit during a first mode of operation of the switching circuit and prevents the precision reference current from being applied to the input of the integrating circuit during a second mode of operation of the switching circuit. The integrating circuit generates a first signal proportional to the integral of the sum of any currents applied to its input. In response to the first signal and to clock pulses, generator means develops an incremental pulse width modulated signal to precisely control the first and second modes of operation of the switching circuit. The incremental pulse width modulated signal and clock pulses are then utilized by an output circuit to generate a digital representaion of the amplitude of the input analog current.

24 Claims, 5 Drawing Figures

ANALOG-TO-DIGITAL CONVERSION APPARATUS

BACKGROUND OF THE INVENTION

1. Field of the Invention

This invention relates to an analog-to-digital conversion apparatus of the pulse width modulation type, and particularly to an incremental pulse width modulation type for precisely switching a precision reference current as a function of the amplitude of an input analog current, while at the same time precisely digitally counting the period during which the precision current is being utilized.

2. Description of the Prior Art

There are many electromagnetic accelerometer digitizers, digital voltmeters and other analog-to-digital conversion devices known in the prior art for converting an analog input into a digital output. Many of these devices utilize pulse width modulated signals in converting the analog input into the digital output. The following U.S. patents are considered representative of the existing state of the prior art.

U.S. Pat. No. 3,500,109 discloses an analog-to-digital converter which sequentially switches positive and negative reference voltages and then converts these switched reference voltages into reference currents. An integrator selectively sums these reference currents with an analog input current to provide an integrator output voltage which is compared in a comparator to the voltage of a triangle wave. When the integrator output voltage is larger than the triangle wave voltage, the sum of the analog input current and a negative reference current is integrated. When the integrator output voltage is smaller than the triangle wave voltage, the sum of the analog input current and a positive reference current is integrated. The output of the comparator is a pulse width modulated signal which is proportional to the input analog signal and is utilized to sequentially control the switching of the positive and negative reference voltages. The switched reference voltages are also used to control the up and down counting of clock pulses in a reversible counter to develop a digital readout representative of the input analog signal value. There are several disadvantages inherent in this device. The pulse width output of the comparator is not synchronized with the clock pulses. This will cause readout errors. The use of two reference voltages leads to two different scale factors for the positive and negative voltage values, with a maximum of bias error occurring about a zero volt input signal. In addition, there is a further loss in scale factor linearity and accurate readout values when voltages are switched.

In U.S. Pat. No. 3,316,547, reference and analog voltages are alternately switched and converted into currents before being applied to an integrator. The integrated value of the currents is applied to a level comparator which controls the gating of clock pulses to a counter. The counter provides the digital output and also controls a flip flop which controls the switching of reference and analog voltages. There are several disadvantages associated with this device. This device appears to be capable of digitizing only one polarity of input voltage. Since the input voltage is applied only part of the time, any change in the amplitude of the input voltage during the time the reference voltage is being utilized will produce an error in the digital output. A switch shorts out the integrating capacitor in the integrator, thereby causing accumulated errors to be developed. The comparator is not triggered by the pulse generator. As a result, when the comparator changes its state, an error of up to one pulse time of the pulse generator can result. Furthermore, a voltage switching technique, with its attendant loss in scale factor linearity and loss in accurate readout values, is used here.

Other voltage switching types of analog-to-digital converters are disclosed in U.S. Pat. Nos. 3,305,856; 3,458,809, and 3,488,652. Each of these converters therefore has the attendant disadvantages of loss of scale factor linearity and loss in accurate readout values.

U.S. Pat. No. 3,305,856 discloses an analog-to-digital converter employing a sawtooth waveform as a switching point determining signal for a voltage comparison circuit or summer which responds to the sum of the sawtooth voltage and an integrated input signal. The comparison circuit controls the switching of a precision solid state switch to alternately apply positive and negative voltages to its output line. The output of the solid state switch is a pulse width modulated signal having a constant period and a first polarity duration proportional to the analog input voltage. Another disadvantage of this converter results from the fact that the feedback switching times of the solid state switch are not synchronized with the time base output or the means for determining the counting period of the universal counter. This limits the accuracy of the readout, since errors result from a loss of a portion of the pulse width appearing at the output of the solid state switch.

The voltage switching type of analog-to-digital converter taught in U.S. Pat. No. 3,458,809 has a constant period conversion cycle. During a first part of the cycle, a switch is enabled by clock pulses to allow a reference voltage to be passed therethrough and then converted into a reference current which is algebraically summed with an analog current at the input of an integrator. During the second part of the cycle, the switch is disabled and only the analog current is applied to the input of the integrator. The percentage of the period occupied by the first part of the cycle adjusts so that it is representative of the value of the input analog signal. A counter counts the clock pulses during one portion of the cycle in order to determine the value of the input analog signal in digital form. An additional disadvantage of this converter is that the feedback period is not synchronized with the clock pulse. Therefore, the pulse width cannot be accurately measured and large linearity errors occur.

The voltage switching type of analog-to-digital converter disclosed in U.S. Pat. No. 3,488,652 is similar to that of U.S. Pat. No. 3,500,109, except that the alternately switched positive and negative reference voltages are filtered, rather than integrated, before being summed with an analog voltage. Also, no triangle wave voltage comparison is made. Instead a comparison of the summed voltages is made with respect to ground. Since no integrator is used here, the output accuracy is relatively low.

None of the above-discussed patents teaches a system which generates an incremental pulse width modulated signal, synchronized to the clock frequency, for selectively switching a precision reference current into the input of an integrating circuit, where it can be summed with an input analog current which is applied at all times.

SUMMARY OF THE INVENTION

Briefly, an improved analog-to-digital conversion apparatus is provided. In a preferred embodiment, the sum of an input analog current and a switched precision reference current is applied to an integrator during a first mode of operation of a switching circuit, while only the input analog current is applied to the integrator during a second mode of operation of the switching circuit. In response to clock pulses and to the output of the integrator, generator means develops an incremental pulse width modulated signal, wherein the pulse width is synchronized to and is varied incrementally in accordance with the clock pulses, for precisely controlling the first and second modes of operation of the switching circuit. The incremental pulse width modulated signal and clock pulses are then utilized by an output circuit to generate a pulse rate which is proportional to the amplitude of the analog current.

It is therefore an object of this invention to provide an improved analog-to-digital conversion apparatus.

Another object of this invention is to provide an analog-to-digital conversion apparatus which develops a pulse width modulation signal wherein the pulse width is varied incrementally in accordance with clock pulses.

Another object of this invention is to provide an analog-to-digital converter which selectively switches a precision reference current either into the input of an integrating circuit or to ground as a function of the pulse width of an incremental pulse width modulated signal.

Another object of this invention is to provide an analog-to-digital conversion system which can be used as an electromagnetic accelerometer digitizer, a digital integrating ammeter, a digital integrating voltmeter or an analog-to-digital converter.

Another object of this invention is to provide an analog-to-digital conversion system which develops an output clock pulse rate which is proportional to the amplitude of an input analog signal.

A further object of this invention is to provide an analog-to-digital conversion system which switches a precision reference current as a function of an incremental pulse width modulated signal and which also utilizes clock pulses and the incremental pulse width modulated signal to develop a digital representation of the amplitude and polarity of an input analog signal.

BRIEF DESCRIPTION OF THE DRAWINGS

These and other objects, features and advantages of the invention, as well as the invention itself, will become more apparent to those skilled in the art in the light of the following detailed description taken in consideration with the accompanying drawings wherein like reference numerals indicate like or corresponding parts through the several views and wherein.

DESCRIPTION OF THE PREFERRED EMBODIMENT

Figure 1:
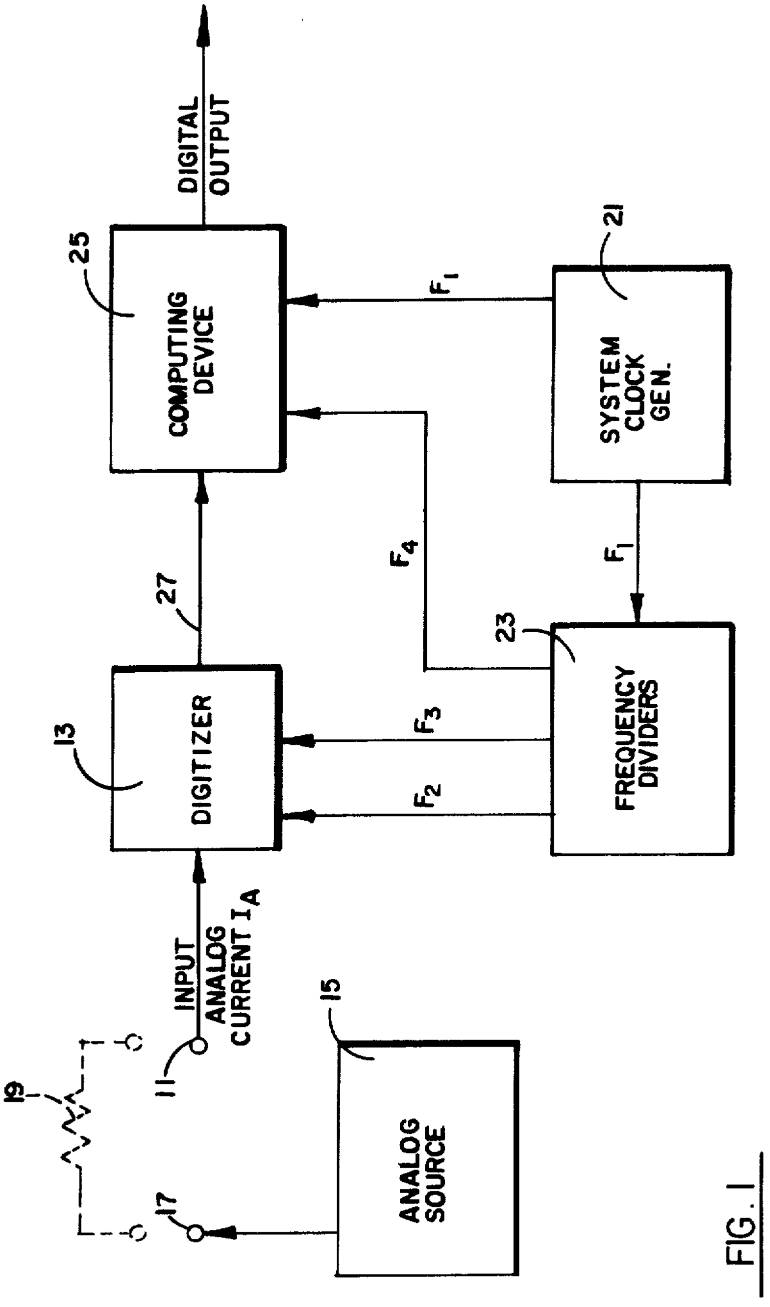
FIG. 1 is a block diagram of a preferred embodiment of the invention.

Referring now to the drawings, FIG. 1 illustrates a block diagram of a preferred embodiment of the incremental pulse width modulated (IPWM) system of the invention. The system of FIG. 1 can be operated as, for example, a digital integrating ammeter, an electromagnetic accelerometer (EMA) digitizer for one EMA channel, a digital integrating voltmeter, or an analog-to-digital (A/D) converter. The system is responsive to an input analog current $I_A$, applied from an input terminal 11 to a digitizer 13, for generating a digital representation of the amplitude of the input analog current. The current $I_A$ may be initially derived from an external analog source 15. The analog source 15 may be either an analog current source or an analog voltage source.

When the analog source 15 is an analog current source, such as one channel of an EMA or some other suitable source of unknown analog current, the analog current $I_A$ is developed by the analog source 15 and applied to a terminal 17, through a lead (not shown) connecting the terminals 17 and 11, and to the digitizer 13. On the other hand, when the analog source 15 is an analog voltage source, such as for the digital integrating voltmeter or the A/D converter operation, a resistor 19 is coupled between the terminals 17 and 11 (instead of a lead) in order to convert the analog voltage from the source 15 into an analog current for application to the digitizer 13.

A system clock generator or crystal controlled oscillator 21 applies a timing signal at a frequency $F_1$ to frequency dividers 23 and to a computing device 25. The frequency dividers 23 may be a sequence of flip flops coupled to perform a plurality of frequency count down operations. The computing device 25 may be, for example, a counter or a digital computer. The frequency dividers 23 count down from the $F_1$ frequency to sequentially develop clock pulse signals at the frequencies $F_2$, $F_3$ and $F_4$. Any combination of frequencies $F_1$, $F_2$, $F_3$ and $F_4$ may be chosen, as long as they are discrete multiples of each other, such as by factors of 5 or factors of 10. For example, in the subsequent description of FIG. 2,$F_1$, $F_2$, $F_3$ and $F_4$ have been chosen to be frequencies of 1 megahertz (MHz), 50 kilohertz (KHz), 100 hertz (Hz) and 1 Hz, respectively.

The clock pulse signals at the frequencies of $F_2$ and $F_3$ are applied to the digitizer 13 to enable the digitizer 13 to convert the analog current $I_A$ into output bursts of pulses having a pulse rate proportional to the amplitude of the input analog current $I_A$. These output bursts of pulses from the digitizer 13 are applied by way of line 27 to the computing device 25 to develop a digital output which represents the amplitude of the current $I_A$. To accomplish this function, the computing device 25 uses the $F_1$ clock signal from the system clock generator 21 as a time base for counting, and theh $F_4$ clock signal from frequency dividers 23 to set the sampling time during which the device is counting. The computing device 25 therefore counts up during each sample time. The device 25 either stores or displays the measurement of $I_A$ during each sample time. It should be noted that the line 27 may be a composite line to supply a complementary pair of output bursts of pulses to the computing device 25, which in turn would convert the complementary pair to a single line to use the information contained therein.

Figure 2:
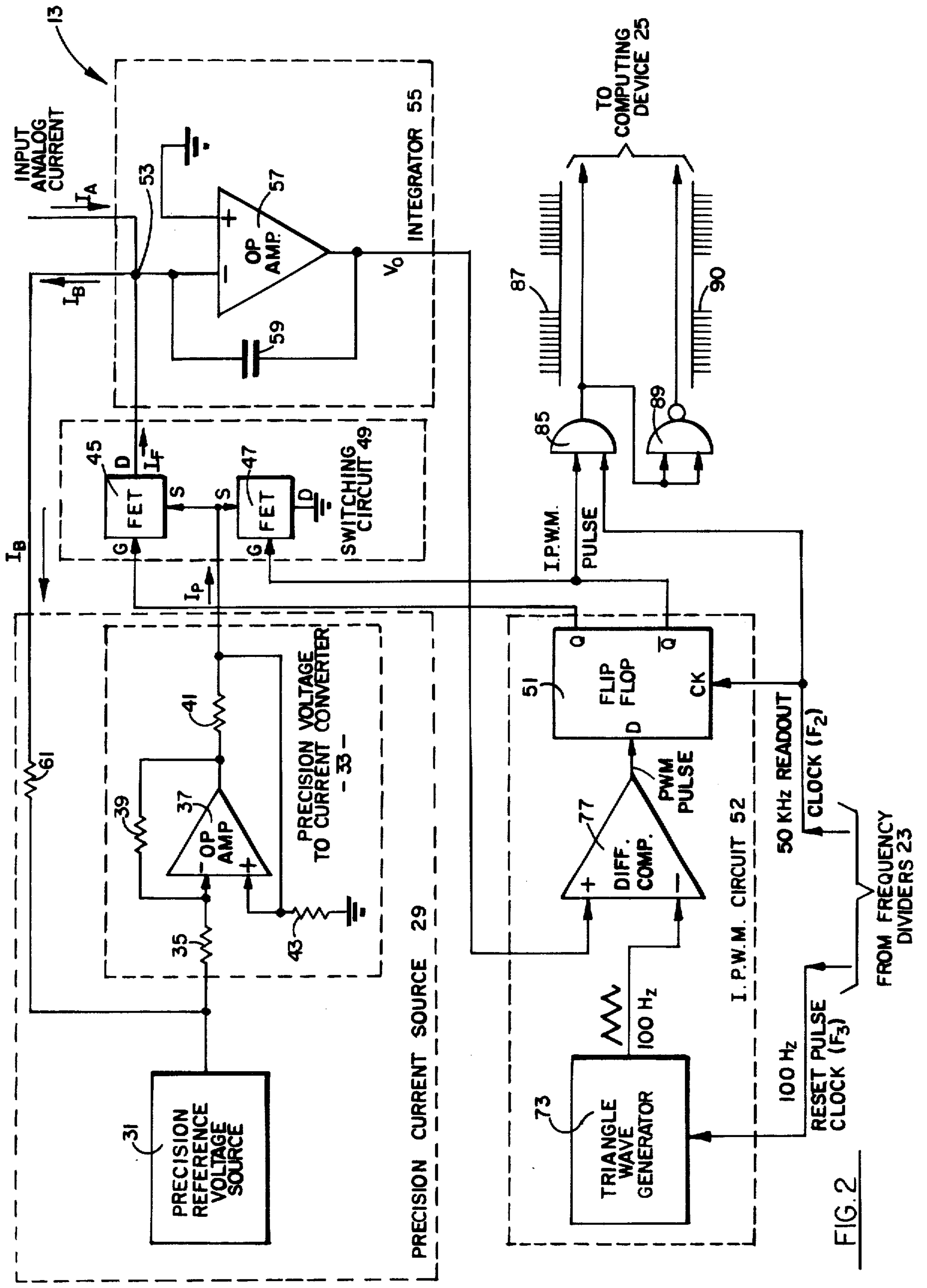
FIG. 2 is a block diagram of the digitizer of FIG. 1.
Figure 3:
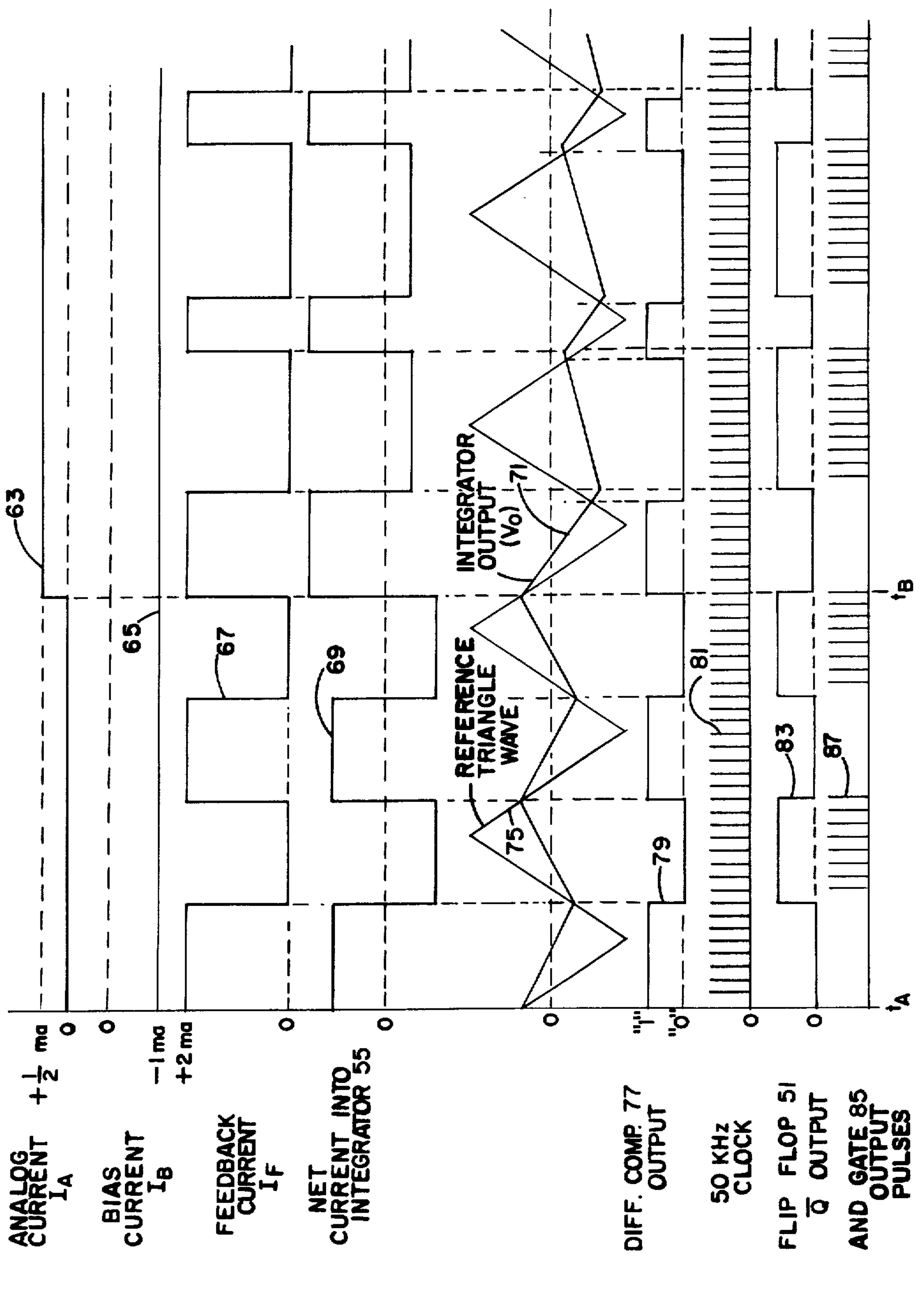
FIG. 3 illustrates waveforms useful in explaining the operation of the digitizer of FIG. 2.

The digitizer 13 will now be explained in detail by referring to FIGS. 2 and 3. FIG. 2 illustrates the digitizer 13 in block diagram form, while FIG. 3 illustrates waveforms useful in explaining the operation of the digitizer 13 of FIG. 2.

Within a precision current source 29, a precision reference voltage from a source 31 is converted by a precision voltage to current converter 33 into a precision current $I_P$. In operation, the precision reference voltage is applied through a resistor 35 to the inverting input of a suitable operational amplifier 37. The output of the amplifier 37 is fed back through a feedback resistor 39 to the inverting input of the amplifier 37 and also through a metering resistor 41 to the non-inverting input of the amplifier 37. The value of the metering resistor 41 determines the amplitude of the precision current $I_P$. A resistor 43 is connected between this non-inverting input and ground to correct for any voltage at the output of the resistor 41.

The application of the output of the amplifier 37 through the resistor 41 converts the output into the precision current $I_P$, which is, in turn, applied to the source (S) electrodes of identical field effect transistors (FETs) 45 and 47 in a switching circuit 49. The operation of the FETs 45 and 47 is controlled by a flip flop 51 in an incremental pulse width modulator (I.P.W.M.) circuit 52 (to be explained later). The Q and Q outputs of the flip flop 51 are respectively coupled to the gate (G) electrodes of the FETs 45 and 47.

When the Q and Q outputs of the flip flop 51 are in "0" and "1" logical states, respectively, the FET 45 is gated off, and the FET 47 is gated on to allow the current $I_P$ to flow from its source electrode (S) to its drain electrode (D) and then back to the voltage source 31 through a common ground connection (not shown). When the Q and Q outputs of the flip flop 51 are in logical "1" and "0" states, respectively, the FET 47 is gated off, and the FET 45 is gated on to allow the current $I_P$ to flow from its source electrode to its drain electrode and then to a summing point 53 in an integrator 55.

The integrator 55 is comprised of a suitable operational amplifier 57 and a feedback capacitor 59 coupled between the output of the amplifier 57 and the summing point 53. The inverting and non-inverting inputs of the amplifier 57 are connected to the summing point 53 and ground, respectively. Therefore, in the operation of the integrator 55, it should be noted that the summing point 53 will essentially be at ground potential since the inverting input will tend to operate at the same ground potential as that of the non-inverting input of the amplifier 57.

Also applied to the summing point 53 is the unknown input analog current $I_A$, which is to be measured. An additional current, a bias current $I_B$, flows from the summing point 53, through a bias resistor 61 and back to the voltage source 31 in the precision current source 29. It can therefore be seen that the precision current source 29 develops two precision constant currents, namely $I_P$ and $I_B$. The bias current $I_B$ is used to set the point of operation of the digitizer 13 of FIG. 2 to mid-range so that the digitizer 13 can use the single polarity switched current $I_P$ in its feedback operation into the summing point 53. The portion of the current $I_P$ being fed through the FET 45 into the summing point 53 will henceforth be designated as $I_F$.

It should be noted at this time that for a unipolar operation of FIG. 2, with the input analog current $I_A$ being of one polarity only, the bias current $I_B$ would be unnecessary and could be eliminated by removing the resistor 61 and the leads thereto and therefrom. In this case, the invention would then only selectively sum the $I_A$ and $I_F$ currents at the summing point 53.

Examples of the currents $I_A$, $I_B$ and $I_F$ are illustrated by the waveforms 63, 65 and 67, respectively, in FIG. 3. These currents are summed at the summing point 53 to develop the net current into the integrator 55 waveform 69 illustrated in FIG. 3.

The integrator 55 develops an output voltage $V_o$ that is proportional to the integral of the sum of the $I_A$, $I_B$ and $I_F$ currents (waveform 69) being applied to the summing point 53. The integrator output voltage $V_o$ is illustrated by the waveform 71 in FIG. 3. It should, of course, be realized that for a unipolar operation of FIG. 2 (as discussed above) the output voltage $V_o$ would be proportional to the integral of the sum of the $I_A$ and $I_F$ currents only.

A triangle wave generator 73 in the I.P.W.M. circuit 52 is responsive to a 100 Hz reset pulse clock ($F_3$) from frequency dividers 23 (FIG. 1) for developing a 100 Hz zero-centered triangle wave signal, illustrated in FIG. 3 by the waveform 75. This triangle wave signal (waveform 75) and the integrator 55 output voltage $V_o$ (waveform 71) are compared together in a differential comparator 77 to develop the waveform 79 (FIG. 3) at the output of the comparator 77. In examining the waveforms 71, 75 and 79, it can be seen that the waveform 79 is in a binary "0" state when the integrator output voltage $V_o$ is negative with respect to the triangle wave signal. In a like manner, the waveform 79 is in a binary "1" state when the integrator output voltage $V_o$ is positive with respect to the triangle wave signal.

The output (waveform 79) of the differential comparator 77 is applied to the D input of the flip flop 51. A 50 KHz readout clock ($F_2$), illustrated by the waveform 81 in FIG. 3, is applied to the clock (Ck) input of the flip flop 51. At each clock pulse time of the 50 KHz readout clock, the Q output of the flip flop 51 either remains in or changes to the binary state of the signal (waveform 79) that was applied to its D input immediately before the clock pulse time. The complement of the Q output appears at the Q output of the flip flop 51. In this manner, at the Q output of the flip flop 51 an I.P.W.M. pulse (waveform 83 in FIG. 3) is developed, having an average pulse width proportional to the amplitude of the input analog current $I_A$ to be measured.

As stated previously, the Q and Q outputs of the flip flop 51 selectively drive the pair of FETs 45 and 47 in the switching circuit 49 to allow the precision current $I_P$ to be either directly returned to the voltage source 31 through ground or summed at the summing point 53 with the $I_A$ and $I_B$ currents. The incremental pulse width modulated outputs of the flip flop 51 therefore determine the length of time that the current $I_P$, and hence $I_F$, is summed with the input analog current $I_A$ and bias current $I_B$.

The I.P.W.M. signal from the Q output of the flip flop 51 is also applied to an AND gate 85 to selectively gate the 50 KHz readout clock pulses therethrough during the "1" state portions of the waveform 83. The output pulses of the AND gate 85, illustrated by the waveform 87 in FIG. 3, are counted by the computing device 25, with the count of the computing device 25 being the digital representation of the amplitude of the unknown analog current $I_A$. When the computing device 25 requires a complementary pair of inputs, the output of the AND gate 85 is inverted by a logical inverter or NAND gate 89 to develop the complement 90 (FIG. 2) of the waveform 87, with the outputs of the AND gate 85 and NAND gate 89 then being applied to the computing device 25.

The digitizer 13 operates to control the pulse width of the I.P.W.M. pulse from each of the complementary Q and Q outputs of the flip flop 51 to enable the FETs 45 and 47 to control the average value of the feedback current $I_F$ such that the average value of the sum of the currents ($I_A$, $I_B$ and $I_F$) entering and leaving the summing point 53 is zero. To more clearly understand the operation of the digitizer 13, assume that the output voltage from the voltage source 31 is −12 volts, the bias resistor 61 has a resistance of 12,000 ohms and the switched current $I_P$, and hence $I_F$, has a value of +2 ma, as illustrated by the waveform 67. Since the summing point 53 is at virtual ground, the bias current $I_B$ is equal to −1 ma, as illustrated in waveform 65.

Further assume that the analog current $I_A = 0$, as illustrated in the waveform 63 between times $t_A$ and $t_B$. Now when the FET 45 is gated off (and the FET 47 is gated on), a steady state bias current $I_B$ of −1 ma flows from the summing point 53, discharging the capacitor 59. When the FET 45 is gated on (and the FET 47 is gated off), +2 ma of feedback current $I_F$ flow into the summing point 53 while −1 ma of bias current $I_B$ flows from the summing point, charging the capacitor 59 with a net current of +1 ma. Since the average value of the sum of the currents ($I_B$ and $I_F$) entering and leaving the summing point 53 must be equal to zero and $I_B$ is equal to a steady state current of −1 ma, the duty cycle of the FET 45 is 50%, with the FET 45 being gated on for as long a time as it is gated off.

Now assume that the analog current $I_A = +½$ ma, as illustrated in the waveform 63 after time $t_B$. Since the current $I_A$ is positive in value, it is flowing into the summing point 53. The bias current $I_B$ is still equal to a steady state −1 ma, regardless of whether the FET 45 is gated on or off. The digitizer 13 will therefore operate to change the pulse width of the I.P.W.M. pulse from the flip flop 51 such that:

$$I_A + I_B + I_F = 0$$

Since $I_A = +½$ ma and $I_B = -1$ ma, the average value ($I_{Fave}$) of the feedback current $I_F$ flowing into the summing point 53 must be equal to +½ ma. Under these assumed facts, the average duty cycle of the FET 45 can be found to be 25% from the following relationship:

$$\text{Duty cycle} = \frac{\text{Time on}}{\text{Time on} + \text{time off}}\ 100\% = \frac{I_{Fave}}{I_F}\ 100\% = \frac{½\ \text{ma}}{2\ \text{ma}}\ 100\% = 25\%$$

In other words, the pulse width of the I.P.W.M. waveform 83 is such that the FET 45 is gated on 25% of the time and gated off 75% of the time, on the average.

Similarly, when $I_A = -½$ ma and $I_B = -1$ ma, $I_{Fave} = +1½$ ma. In this case the duty cycle of the FET 45 is controlled by the I.P.W.M. circuit 52 to be 75%, with the FET 45 being gated on 75% of the time and gated off 25% of the time, on the average.

With the circuitry implemented as shown in FIG. 2, the digitizer will operate with values of $I_A$ between −1 ma and +1 ma. Thus, any changes in the amplitude or polarity of the input analog current $I_A$ are detected by changes in the pulse width of the positive portion of the I.P.W.M. pulse, and measured by the corresponding changes in the number of readout clocks passing through the AND gate 85 (and NAND gate 89) to the computing device 25. It should, however be understood that other operating parameters are equally within the purview of the invention. For example, if the digitizer 13 of FIG. 2 were implemented for unipolar operations, as discussed above, the digitizer could operate with values of $I_A$ either between 0 ma and +1 ma or between 0 ma and −1 ma. The digitizer of FIG. 2 could also be implemented to develop first and second output bursts of pulses during the times when the I.P.W.M. pulse was positive and negative, respectively. In this case the computing device 25 could be an up/down counter which would increment its count with the burst of pulses developed during the time the I.P.W.M. pulse was, for example, positive and decrement its count with the burst of pulses developed during the time the I.P.W.M. pulse was negative.

There are several additional important advantages of the invention which should now be discussed.

Firstly, by switching the constant current $I_P$ from the precision current source 29, negligible errors result even though the FET switches 35, 37, 39 and 41 have finite "on" resistances. In those previously mentioned prior art systems which utilized voltage switching techniques, switching errors resulted which were cumulative, resulting in relatively substantial output errors.

Secondly, the frequency of the I.P.W.M. pulse from each of the complementary Q and Q outputs of the flip flop 51 can be low and at a constant frequency so that switching errors can be made negligible.

Thirdly, the measurement of the duration or pulse width of the positive portion of the I.P.W.M. pulse is substantially an exact measurement, because the pulse width changes only in discrete steps equal to the period of the readout clock pulses being applied to the flip flop 51 and being read out of the AND gate 85 (and NAND gate 89). Other known digitizing systems utilizing pulse width modulation reset pulses fail to increment the pulse width of the pulse width modulation (PWM) pulse with the readout clock pulses. Thus, the measure of the pulse period in these prior art systems results in a maximum error of plus or minus one clock pulse period per period of the PWM pulse, which can become a very large cumulative error. The incremental pulse width modulation technique of the invention avoids such a cumulative error, because any error in the measurement of the duration of the positive portion of the I.P.W.M. pulse, which is either plus or minus one readout clock pulse period, is stored in the integrator 55 and does not result in an accumulated error. In fact, for any given number of I.P.W.M. pulse periods, the total error in the given number of I.P.W.M. pulse periods remains either plus or minus one readout clock pulse period. This one readout clock pulse period error is stored in the charge of the integrator capacitor 59 and is carried over into the next I.P.W.M. pulse period, without the accumulation of any added error.

Fourthly, the utilization of incremental pulse width modulation in the invention allows the use of a relatively low $F_3$ frequency or reset pulse rate. It will be recalled that in FIG. 2 the frequency $F_3$ was selected to be 100 Hz. This 100 Hz reset pulse clock frequency was utilized by the I.P.W.M. circuit 52 to generate the triangle wave (waveform 75) for a voltage comparison with the integrator 55 output $V_o$ (waveform 71). This voltage comparison resulted in the development of the I.P.W.M. pulse. The $F_3$ frequency therefore controls the period of the I.P.W.M. pulse (waveform 83) at the output of the flip flop 51. The lower frequency limit for the choice of $F_3$ is set by the required bandwidth for the digitizer 13. Thus, for certain applications the frequency $F_3$ can be as low as 10 Hz or as high as 1000 Hz. At the same time, the output resolution, or accuracy of the I.P.W.M. pulse measurement, can be set to any value desired. In the embodiment of FIG. 2, a 50 KHz readout clock frequency was used for $F_2$. This 50 KHz readout clock frequency gives an output resolution of one part per 50,000 of full scale for a 1-second sample period (or $F_4$). If $F_2$ were selected to be = 1 MHz, an output resolution could be achieved of one part per million of full scale for the 1-second sample period of $F_4$. In a like manner, much higher output resolutions can be achieved with this invention. However, it will be recalled that the reset pulse rate $F_3$, the readout clock $F_2$ and sample rate $F_4$, must be derived from the same system clock generator 21 (FIG. 1) and that they be related to each other by appropriate discrete ratios.

Finally, the digitizer 13 produces output pulses from the AND gate 85, as well as from the NAND gate 89, which can be readily counted, rather than a pulse width modulated signal which requires peripheral equipment to measure the times of the pulse periods.

Figure 4:
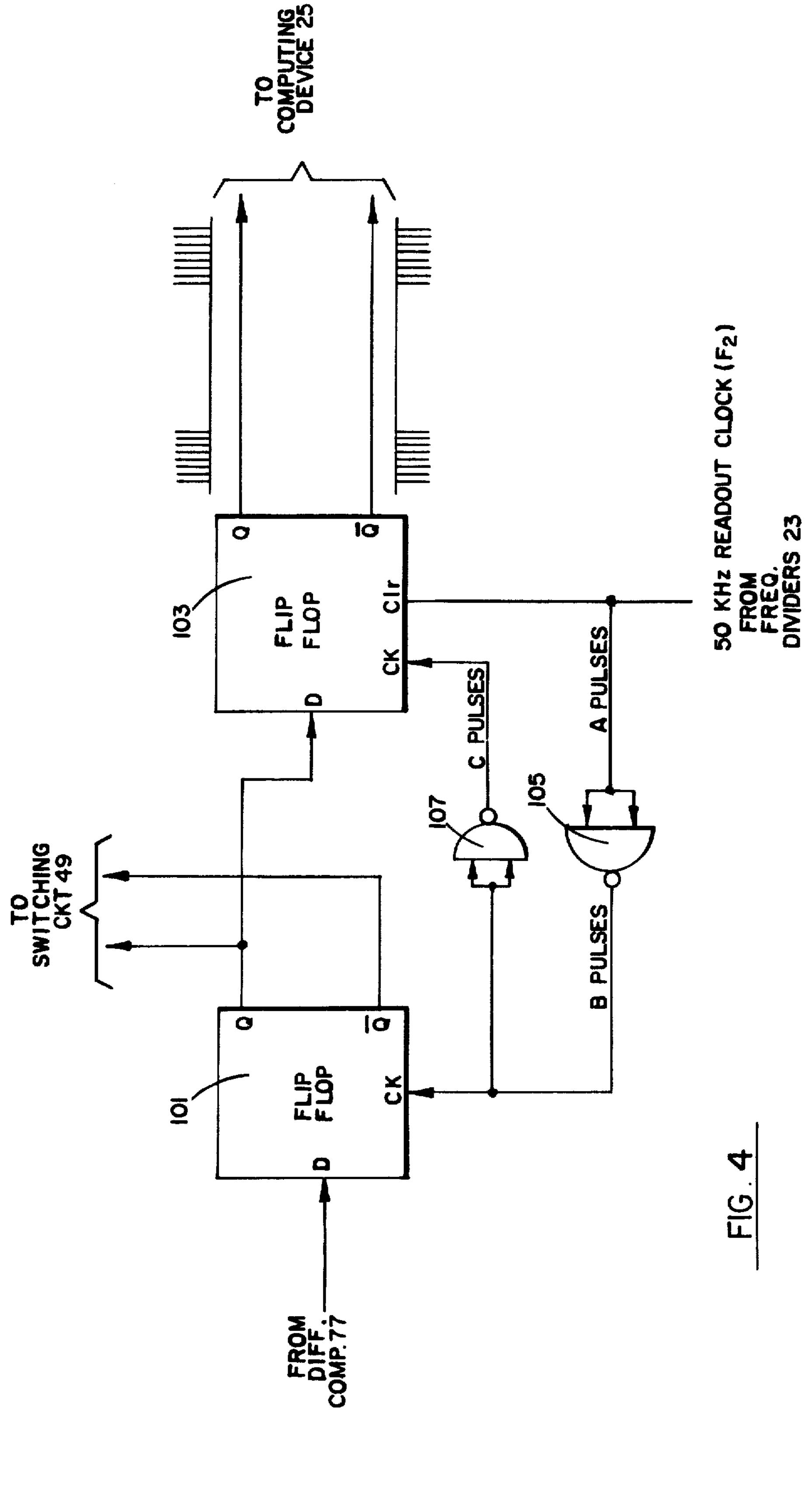
FIG. 4 illustrates a modification of the digitizer of FIG. 2.

Referring now to FIG. 4, a modification of the digitizer 13 of FIG. 2 is illustrated. The waveforms of FIG. 5 will also be referred to in explaining the operation of the modification of FIG. 4. In the circuit of FIG. 4, D-flip flops 101 and 103 and NAND gates 105 and 107 replace the D-flip flop 51, AND gate 85 and NAND gate 89 in FIG. 2.

Figure 5:
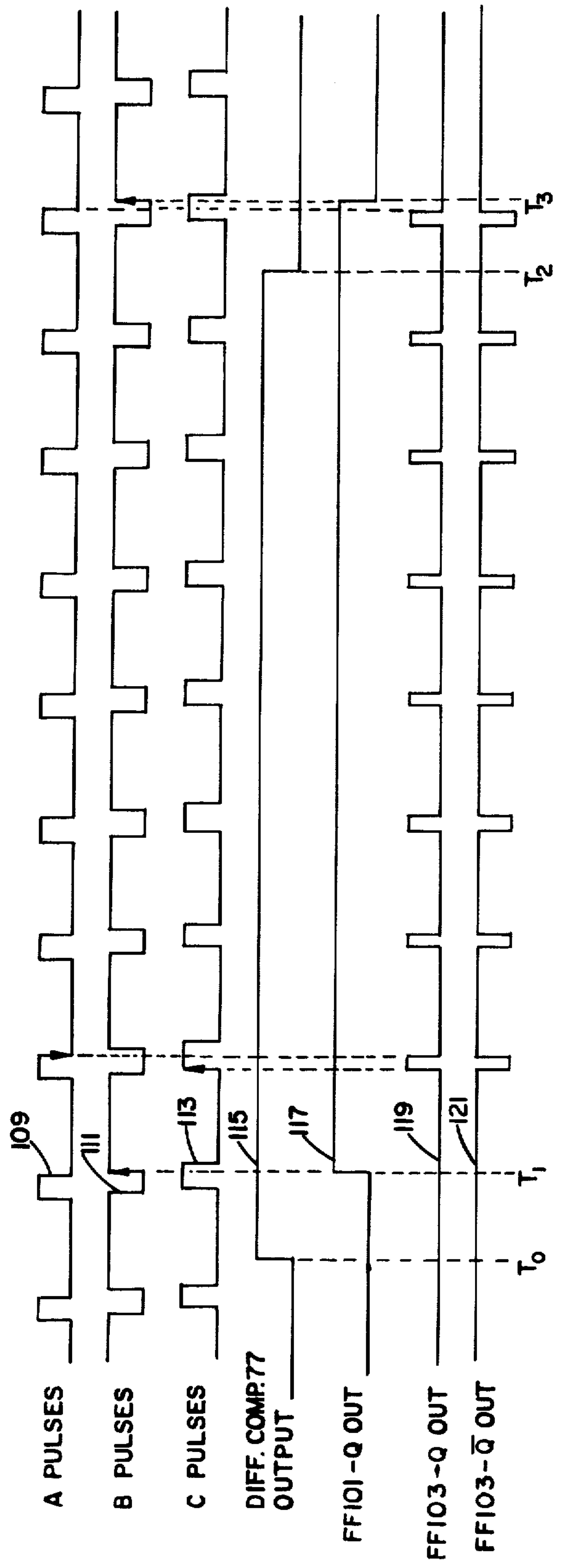
FIG. 5 illustrates waveforms useful in explaining the operation of the modification of FIG. 4.

The waveform 115 (FIG. 5) from the differential comparator 77 output is applied to the D input of the flip flop 101. The 50 KHz readout clock ($F_2$), designated as A pulses (waveform 109), is inverted and delayed by, for example, 50 nanoseconds by NAND gate 105 in order to develop B pulses (waveform 111). The B pulses are then inverted and delayed by, for example, 50 nanoseconds by NAND gate 107 in order to develop C pulses, illustrated in waveform 113 in FIG. 5. The rising trailing edge of each B pulse is used to clock the flip flop 101 to cause its Q output to change to or remain in whatever logical state that the waveform 115 (from the comparator 77) was in just prior to the occurrence of the rising edge of the B pulse. As seen in FIG. 5, the waveform 115 changed from a "0" state to a "1" state at time $t_0$. However, the Q output of the flip flop 101, as illustrated in waveform 117, will remain in a "0" state until the rising edge of the next B pulse, which occurs at time $t_1$. At the time $t_1$, the Q and Q outputs of the flip flop 101 respectively change to "1" and "0" state signals to switch the operation of the switching circuit 49, as discussed previously.

The waveform 117 from the Q output of the flip flop 101 is applied to the D input of the flip flop 103. The Q and Q outputs of the flip flop 103, respectively shown by the waveforms 119 and 121 in FIG. 5, remain in the "0" and "1" states, respectively, that they were in just before time $t_1$, until the rising edge of the first C pulse 113 occurring after the time $t_1$ clocks the flip flop 103 to its opposite states. The Q and Q outputs of the flip flop 103 then remain in "1" and "0" states, respectively, until the next falling edge of an A pulse 109 clears the flip flop 103. Upon being cleared the Q and Q outputs of the flip flop 103 respectively change to "0" and "1" states.

As long as the Q output of the flip flop 101 remains in a "1" state, the flip flop 103 will generate a burst of pulses by being alternately clocked and cleared by the C and A pulses, in the manner described above.

At time $t_2$, the waveform 115 from the comparator 77 changes from a "1" to a "0" state. However, the Q output of the flip flop 101 will remain in its "1" state condition, until the flip flop 101 is clocked by the rising edge of the next B pulse 111, which occurs at time $t_3$. At time $t_3$, the Q and Q outputs of the flip flop 101 change to "0" and "1" states, respectively, thereby switching the operation of the switching circuit 49 as discussed previously. As this time ($t_3$), the "0" state output from the flip flop 101, which is being applied to the D input of the flip flop 103, terminates the generation of any more pulses at the Q and Q outputs of the flip flop 103. The flip flop 103 will again start generating bursts of complementary pulses at its Q and Q outputs after the waveform 115 enables the flip flop 101 to be clocked to its opposite output states.

The invention thus provides an incremental pulse width modulated analog-to-digital conversion system which during an I.P.W.M. pulse period precisely switches and enables a precision reference current to be summed with an unknown analog current at the input of an integrator as a function of the amplitude of the input analog current, while at the same time synchronized readout pulses are precisely counted during the I.P.W.M. pulse period to precisely measure the period of the I.P.W.M. pulse.

While the salient features have been illustrated and described, it should be readily apparent to those skilled in the art that modifications can be made within the spirit and scope of the invention as set forth in the appended claims.

What is claimed is:

1. An analog-to-digital conversion system comprising:

first means for generating precision and bias currents;

switching means for passing the precision current as an output precision current during a first mode of operation and for directly returning the precision current to said first means during a second mode of operation;

integrator means for generating a first signal proportional to the integral of the sum of the bias and output precision currents and an unknown input analog current;

second means for generating a second signal in response to the first signal, the second signal having one of first and second states as a function of the amplitude of the first signal;

third means responsive to the second signal and to clock pulses for controlling the first and second modes of operation of said switching means and for generating an output pulse rate of clock pulses proportional to the unknown input analog current.

2. An analog-to-digital conversion system comprising:

first means for generating a precision current;

switching means for passing the precision current as an output precision current during a first mode of operation and for preventing the precision current from being passed as an output precision current during a second mode of operation;

integrator means responsive to the output precision current and to an unknown input analog current for generating a first signal proportional to the integral of the sum of the currents applied thereto;

second means for generating a first pulse width modulated signal as a function of the first signal; and third means responsive to the first pulse width modulated signal and to clock pulses for generating a second pulse width modulated signal for controlling the first and second modes of operation of said switching means, and for generating an output pulse rate of clock pulses proportional to the unknown input analog current.

3. The system of claim 2 wherein said second means includes:

generator means for developing a second signal; and a comparator coupled to said generator means for generating the first pulse width modulated signal, the first pulse width modulated signal being in a binary one state when the first signal has a first polarity with respect to the second signal and being in a binary zero state when the first signal has a second polarity with respect to the second signal.

4. An analog to digital conversion apparatus comprising:

first means for generating a precision reference current;

an integrating circuit having an input, said input adapted to receive an input analog current;

switching means for allowing the reference current to be summed with the input analog current at said input during a first mode of operation of said switching means and for preventing the reference current from being applied to said input during a second mode of operation of said switching means, said integrating circuit generating a first signal proportional to the integral of the sum of the currents applied to said input thereof;

generator means responsive to the first signal for developing a pulse width modulated signal to control the first and second modes of operation of said switching means; and output means responsive to the pulse width modulated signal and to the clock pulses for generating a digital representation of the amplitude of the input analog current.

5. The apparatus of claim 4 wherein said generator means includes:

a signal source for developing the clock pulses and a reference signal; and second means responsive to the first signal, reference signal and clock pulses for developing the pulse width modulated signal to control the first and second modes of operation of said switching means.

6. The apparatus of claim 4 wherein said first means includes:

a voltage source for developing a precision reference voltage; and a current source responsive to the precision reference voltage for generating the precision reference current.

7. The apparatus of claim 6 wherein said first means further includes:

bias means, coupled between said voltage source and said input, for applying a bias current to said input, said integrating circuit generating the first signal proportional to the integral of the sum of the reference, bias and input analog currents during the first mode of operation.

8. The apparatus of claim 4 wherein said switching means includes:

a first switch enabled by said generator means to pass the reference current to said input during the first mode of operation; and a second switch enabled by said generator means to return the reference current to said first means during the second mode of operation.

9. The apparatus of claim 8 wherein each of said first and second switches is a field effect transistor.

10. The apparatus of claim 5 wherein said signal source includes:

a clock generator for generating basic timing pulses; and frequency divider means responsive to the basic timing pulses for developing the clock pulses and reference signal.

11. The apparatus of claim 5 wherein said second means includes:

a generator responsive to the reference signal for developing a preselected signal waveform;

a comparator for developing a rectangular waveform in response to the first signal and the preselected signal waveform, the rectangular waveform being in a first binary state when the first signal is in a first polarity relationship with respect to the preselected signal waveform and in a second binary state when the first signal is in a second polarity relationship with respect to the preselected signal waveform; and flip flop means responsive to the rectangular waveform and the clock pulses for developing the pulse width modulated signal.

12. The apparatus of claim 11 wherein said flip flop means includes a first flip flop.

13. The apparatus of claim 11 wherein said output means includes:

gating means responsive to the pulse width modulated signal for passing clock pulses during the first mode of operation and for blocking clock pulses during the second mode of operation; and counting means responsive to the clock pulses passed by said gate circuit during each first mode of operation for generating a digital representation of the amplitude of the input analog current.

14. The apparatus of claim 13 wherein said output means further includes an inverter for also applying to said counting means the complements of the clock pulses passed by said gating means.

15. The apparatus of claim 11 wherein said flip flop means includes:

a first delay circuit responsive to the clock pulses for developing first delayed clock pulses; and a first flip flop responsive to the rectangular waveform and the first delayed clock pulses for developing the pulse width modulated signal.

16. The apparatus of claim 15 wherein said output means includes:

a second delay circuit responsive to first delayed clock pulses for developing second delayed clock pulses;

a second flip flop responsive to clock pulses, second delayed clock pulses and the pulse width modulated signal for developing output pulses during the first mode of operation; and counting means responsive to the output pulses for generating a digital representation of the amplitude of the input analog current.

17. The apparatus of claim 5 wherein said switching means includes:

a first switch enabled by said second means to pass the reference current to said input during the first mode of operation; and a second switch enabled by said second means to return the reference current to said first means during the second mode of operation.

18. The apparatus of claim 17 wherein said second means includes:

a generator responsive to the reference signal for developing a preselected signal waveform;

a comparator for developing a rectangular waveform in response to the first signal and the preselected signal waveform, the rectangular waveform being in a first binary state when the first signal is in a first polarity relationship with respect to the preselected signal waveform and in a second binary state when the first signal is in a second polarity relationship with respect to the preselected signal waveform; and flip flop means responsive to the rectangular waveform and the clock pulses for developing the pulse width modulated signal.

19. The apparatus of claim 18 wherein said signal source includes:

a clock generator for generating basic timing pulses; and frequency divider means responsive to the basic timing pulses for developing the clock pulses and reference signal.

20. The apparatus of claim 19 wherein said first means includes:

a voltage source for developing a precision reference voltage; and a current source responsive to the precision reference voltage for generating the precision reference current.

21. The apparatus of claim 20 wherein said first means further includes:

bias means, coupled between said voltage source and said input, for applying a bias current to said input, said integrating circuit generating the first signal proportional to the integral of the sum of the reference, bias and input analog currents during the first mode of operation.

22. The apparatus of claim 21 wherein said output means includes:

gating means responsive to the pulse width modulated signal for passing clock pulses during the first mode of operation and for blocking clock pulses during the second mode of operation; and counting means responsive to the clock pulses passed by said gate circuit during each first mode of operation for generating a digital representation of the amplitude of the input analog current.

23. The apparatus of claim 21 wherein said flip flop means includes:

a first delay circuit responsive to the clock pulses for developing first delayed clock pulses; and a first flip flop responsive to the rectangular waveform and the first delayed clock pulses for developing the pulse width modulated signal.

24. The apparatus of claim 23 wherein said output means includes:

a second delay circuit responsive to first delayed clock pulses for developing second delayed clock pulses;

a second flip flop responsive to clock pulses, second delayed clock pulses and the pulse width modulated signal for developing output pulses during the first mode of operation; and counting means responsive to the output pulses for generating a digital representation of the amplitude of the input analog current.

* * * * *

UNITED STATES PATENT AND TRADEMARK OFFICE
CERTIFICATE OF CORRECTION

PATENT NO. : 3,918,050
DATED : November 4, 1975
INVENTOR(S) : Adrian K. Dorsman

It is certified that error appears in the above-identified patent and that said Letters Patent are hereby corrected as shown below:

Column 5, line 27, change "Q and Q" to -- Q and $\bar{Q}$ --
line 30, change "Q and Q" to -- Q and $\bar{Q}$ --
line 36, change "Q and Q" to -- Q and $\bar{Q}$ --
Column 6, line 44, change "Q output of" to -- $\bar{Q}$ output of --
line 45, change "Q" to -- $\bar{Q}$ --
line 49, change "Q and Q" to -- Q and $\bar{Q}$ --
line 59, change "Q" to -- $\bar{Q}$ --
Column 7, line 8, change "Q and Q" to -- Q and $\bar{Q}$ --
Column 8, line 28, change "Q and Q" to -- Q and $\bar{Q}$ --
Columns 7 and 8, line 49, change:

$$\text{"Duty cycle} = \frac{\text{Time on}}{\text{Time on + time off}}\ 100\% = \frac{I_{Fave}}{I_F}\ 100\% = \frac{\frac{1}{2}\text{ ma}}{2\text{ ma}}\ 100\% = 25\%\text{"}$$

to:

$$\text{-- Duty cycle} = \left(\frac{\text{Time on}}{\text{Time on + time off}}\right) 100\% = \left(\frac{I_{Fave}}{I_F}\right) 100\% = \left(\frac{\frac{1}{2}\text{ ma}}{2\text{ ma}}\right) 100\% = 25\%\text{ --}$$

Column 9, line 56, change "Q and Q" to -- Q and $\bar{Q}$ --
line 62, change "Q" to -- $\bar{Q}$ --
line 67, change "Q and Q" to -- Q and $\bar{Q}$ --
Column 10, line 14, change "Q and Q" to -- Q and $\bar{Q}$ --
line 20, change "Q and Q" to -- Q and $\bar{Q}$ --
line 22, change "Q and Q" to -- Q and $\bar{Q}$ --

Signed and Sealed this

*twenty-seventh* Day of *April 1976*

[SEAL]

*Attest:*

RUTH C. MASON
*Attesting Officer*

C. MARSHALL DANN
*Commissioner of Patents and Trademarks*